United States Patent [19]

Sakakibara et al.

[11] Patent Number: 4,992,846
[45] Date of Patent: Feb. 12, 1991

[54] POLYCRYSTALLINE SILICON ACTIVE LAYER FOR GOOD CARRIER MOBILITY

[75] Inventors: Nobuyoshi Sakakibara; Mitutaka Katada, both of Nishio; Seizi Huzino, Anjo; Tadashi Hattori, Okazaki, all of Japan

[73] Assignee: Nippon Soken, Inc., Nishio, Japan

[21] Appl. No.: 549,547

[22] Filed: Jul. 9, 1990

Related U.S. Application Data

[63] Continuation of Ser. No. 172,572, Mar. 24, 1988, abandoned.

[30] Foreign Application Priority Data

Mar. 25, 1987 [JP] Japan .................................. 62-70740

[51] Int. Cl.$^5$ ..................... H01L 29/04; H01L 29/78; H01L 27/12; H01L 45/00
[52] U.S. Cl. .......................... 357/59; 357/4; 357/23.7; 357/60; 437/973
[58] Field of Search ...................... 357/4, 23.7, 59, 60; 437/973

[56] References Cited

U.S. PATENT DOCUMENTS

| | | | |
|---|---|---|---|
| 4,268,848 | 5/1981 | Casey et al. | 357/60 |
| 4,351,856 | 9/1982 | Matsui et al. | 427/38 |
| 4,513,022 | 4/1985 | Jansen et al. | 427/39 |
| 4,719,501 | 1/1988 | Nakagawa et al. | 357/59 |
| 4,755,865 | 7/1988 | Wilson et al. | 357/63 |
| 4,775,641 | 10/1988 | Duffy et al. | 437/21 |

FOREIGN PATENT DOCUMENTS 56-125568 of 1951 Japan .
59-126666 7/1986 Japan .
63-119576 11/1986 Japan .

OTHER PUBLICATIONS

Spear, "Localized States in Amorples Semiconductors" Proc. on the 5th Inal. Conf. on Amer. & Liq. Sem., 73
Matsumura, Amorphous Silicon Transistors & IC, Jap. J. of Appl. Phys, vol. 22, 83.

Primary Examiner—Andrew J. James
Assistant Examiner—Stephen D. Meier
Attorney, Agent, or Firm—Cushman, Darby & Cushman

[57] ABSTRACT

In a method of producing a semiconductor device, an amorphous silicon layer is deposited on a polycrystalline silicon layer formed on an insulator layer (SiO$_2$). Ions are implanted into the amorphous silicon layer while heat treating the amorphous silicon layer at a low temperature thereby forming a solid-phase growth layer, and a transistor is formed of the solid-phase growth layer.

4 Claims, 6 Drawing Sheets

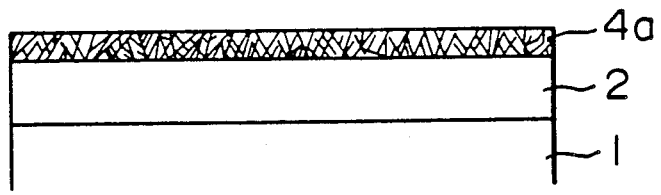
FIG. 2(A)
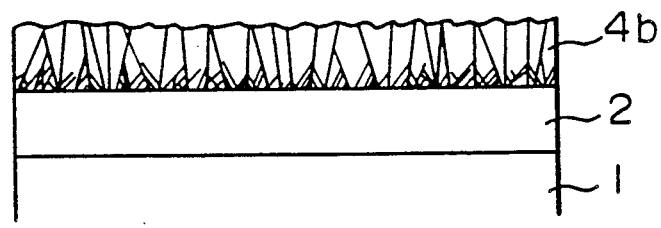
FIG. 2(B)
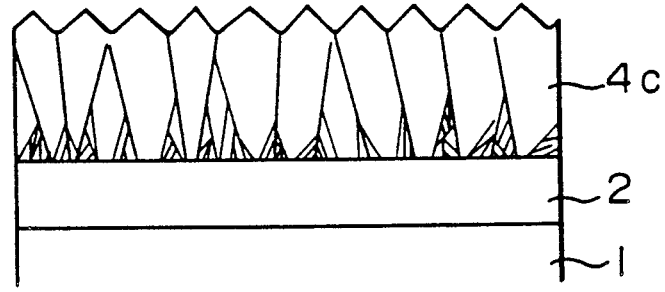
FIG. 2(C)
FIG. 3
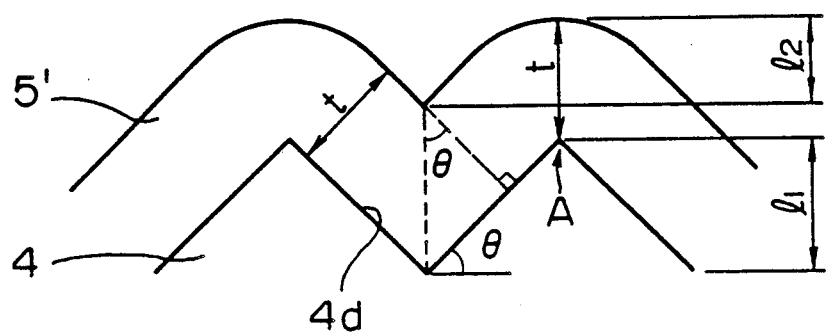

POLYCRYSTALLINE SILICON ACTIVE LAYER FOR GOOD CARRIER MOBILITY

This is a continuation of application Ser. No. 07/172,572, filed on Mar. 24, 1988, abandoned.

BACKGROUND OF THE INVENTION

1. Field of the Invention

This invention relates to a semiconductor device and a method of producing the same. More particularly, this invention relates to improvements in a semiconductor device of SOI (silicon on insulator) structure using polycrystalline silicon and a method of producing such a semiconductor device.

2. Description of the Prior Art

A semiconductor device of SOI structure using polycrystalline silicon is now available, and such a structure is considered as an effective means for realizing desired three-dimensional integration of semiconductor devices. That is, three-dimensional integration of a semiconductor device can be attained by thermal oxidation of a silicon wafer to deposit polycrystalline silicon on an insulator layer which is a film of $SiO_2$ and then heat treating this polycrystalline silicon as by laser annealing to promote crystallization of the polycrystalline silicon, thereby forming a semiconductor device such as a MOS transistor on the polycrystalline silicon layer deposited on the $SiO_2$ film.

However, in a semiconductor device using polycrystalline silicon as described above, the polycrystalline silicon layer includes portions which remain in the form of the polycrystal, and the presence of many crystal grain boundaries leads to a disadvantage such as degradation of electrical properties including carrier mobility. This disadvantage can be obviated by decreasing the number of grain boundaries which provide the source of the disadvantage, and the number of grain boundaries can be decreased by increasing the size of the individual crystal grains. However, in the case of the polycrystalline silicon layer which is not doped with an impurity, application of simple heat treatment hardly causes crystal growth, and, for this reason, the size of the crystal grains cannot be increased. On the other hand, the size of the crystal grains can be increased when the polycrystalline silicon layer is doped with an impurity. In this case, in order to increase the size of the crystal grains, it is necessary to dope the polycrystalline silicon layer with an impurity having a high concentration. Therefore, even when the number of grain boundaries in the polycrystalline silicon layer can be decreased by such a method, it is difficult to utilize this polycrystalline silicon layer as an active region (a current path region) of the semiconductor device because the impurity concentration of the polycrystalline silicon layer is high.

Further, in a film of polycrystalline silicon commonly used in a semiconductor device and having a thickness smaller than 5,000 Å, the size of crystal grains is small and, therefore, there are many crystal grain boundaries. Also, because the individual crystals have their crystallographic axes oriented at random, the performance of the semiconductor device cannot be sufficiently improved.

SUMMARY OF THE INVENTION

It is an object of the present invention to provide a semiconductor device in which a polycrystalline silicon film having a satisfactory crystallinity and a satisfactory film surface roughness is used in its active region to improve its electrical properties and to also improve the accuracy of mask alignment during patterning, and also to provide a method of reliably and easily making such a semiconductor device at a low cost.

In accordance with one aspect of the present invention, there is provided a semiconductor device of SOI structure using polycrystalline silicon, comprising a polycrystalline silicon layer having a predetermined thickness formed on an insulator layer, and a solid-phase growth layer formed on the polycrystalline silicon layer and having a crystallinity succeeding that of the polycrystalline silicon layer, the solid-phase growth layer being used as an active region of the semiconductor device of SOI structure.

In accordance with another aspect of the present invention, there is provided a method of making a semiconductor device comprising the steps of forming a polycrystalline silicon layer on an insulator layer, depositing an amorphous silicon layer on the polycrystalline silicon layer and then implanting ions into the amorphous silicon layer while heat treating the amorphous silicon layer at a low temperature thereby forming a solid-phase growth layer, and forming a semiconductor device on the solid-phase growth layer.

According to the present invention described above, the crystal grains have their <110> axes oriented in a direction perpendicular to the surface of the polycrystalline silicon film in the vicinity of the surface of the polycrystalline silicon film when the film thickness is larger than the predetermined value, and the crystal grains have a large size. The surface roughness of the polycrystalline silicon film tends to be degraded with the increase in the film thickness of the polycrystalline silicon film. Therefore, when an amorphous silicon layer is deposited on the polycrystalline silicon film, this amorphous silicon layer is isotropically deposited without regard to the orientation of the crystal grains present in the vicinity of the surface of the polycrystalline silicon film. Thus, the amorphous silicon layer has a surface roughness improved over that of the polycrystalline silicon film. Then, when ions are implanted into this amorphous silicon layer while heat treating the amorphous silicon layer for a long period of time at a low temperature, the amorphous silicon layer succeeds the crystallinity of the basic polycrystalline silicon film, so that a <110> axially oriented solid-phase growth layer can be formed. When this solid-phase growth layer is used as, for example, an active region of a transistor, scattering of electrons at the interface between the silicon layer and a gate insulator film is minimized because of the good crystallinity and improved surface roughness of the growth layer, so that electrical properties of the transistor can be improved. Further, when a P-channel transistor and an N-channel transistor are formed in the same silicon substrate in the manner described above, they are completely electrically isolated from each other by the underlying insulator layer. Therefore, the present invention solves the problem of so-called latch-up occurred hitherto when such transistors are formed in a single silicon substrate.

BRIEF DESCRIPTION OF THE DRAWINGS

FIGS. 2(A) to 2(C) are schematic sectional views showing how the basic polycrystalline silicon film is deposited and grows on the silicon oxide film shown in FIG. 1.

FIG. 3 is a diagrammatic view illustrating how deposition of an amorphous silicon layer on the polycrystalline silicon film improves the surface smoothness.

DESCRIPTION OF THE PREFERRED EMBODIMENTS

Figure 1:
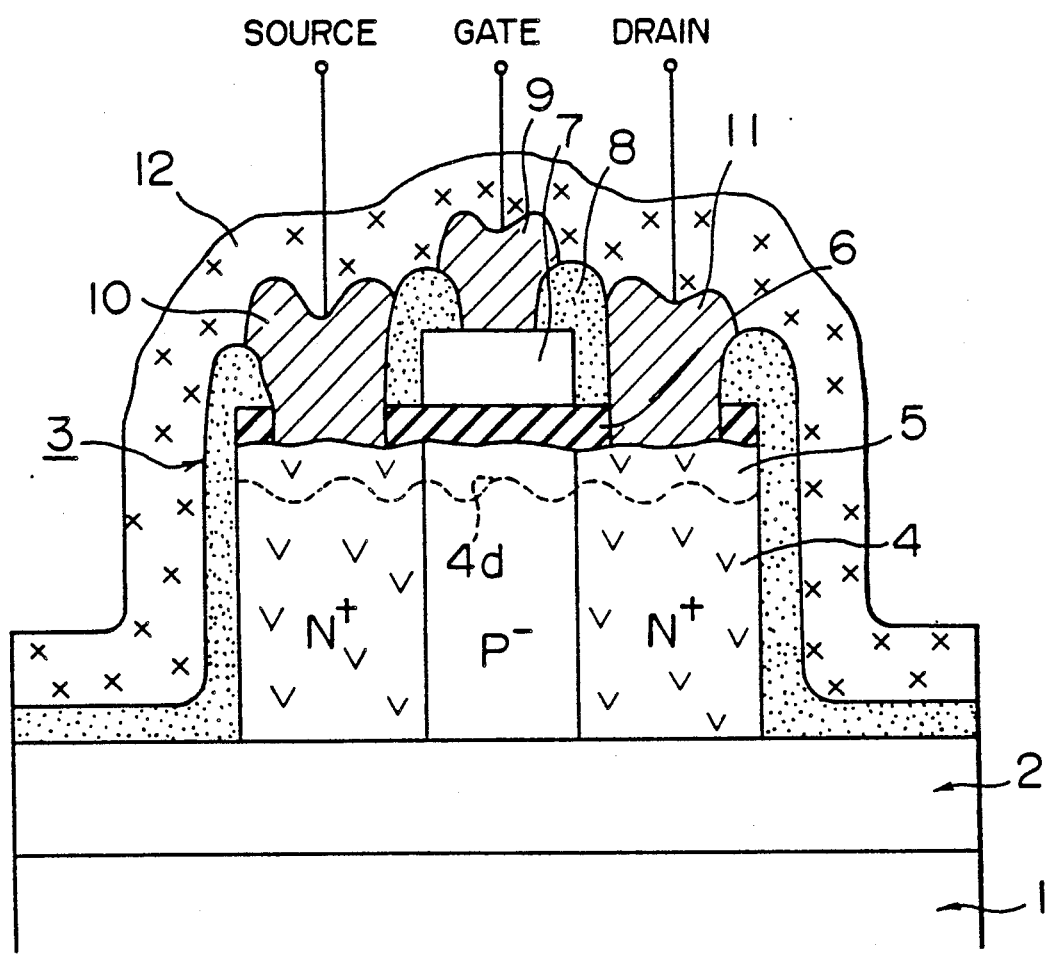
FIG. 1 is a schematic, partly longitudinal sectional view of a first embodiment of the semiconductor device according to the present invention.

FIG. 1 shows an N-channel polycrystalline silicon transistor of SOI structure. In FIG. 1, the reference numeral 1 designates a substrate of monocrystalline silicon, and 2 designates an insulator film of silicon oxide, $SiO_2$, formed by thermal oxidation of the monocrystalline silicon substrate 1. An N-channel polycrystalline silicon transistor formed on the silicon oxide film 2 is generally designated by the reference numeral 3.

The N-channel polycrystalline silicon transistor 3 includes a basic polycrystalline silicon film 4 about 0.5 to 1.5 μm thick deposited on the $SiO_2$ film 2 by means of low-pressure CVD (chemical vapor deposition) at a temperature of about 610° C. Adjacent to the upper surface of the polycrystalline silicon film 4, a solid-phase silicon growth layer 5 is formed by the steps of cleaning the film surface 3d of the polycrystalline silicon film 4 by means of, for example, argon sputtering, depositing then an amorphous silicon layer on the cleaned film surface 4d of the polycrystalline silicon film 4 by means of, for example, plasma CVD, and then causing solid-phase growth of the amorphous silicon layer. The thickness of the solid-phase silicon growth layer 5 is about 2,000 Å. The transistor 3 further includes a gate insulator film 6, a polycrystalline silicon gate 7, an interlayer insulator film 8, a gate electrode 9, a source electrode 10, a drain electrode 11, and a passivation film 12.

The polycrystalline silicon film 4 includes an $N^+$-type source region and an $N^+$-type drain region formed by doping with an N-type impurity and a $P^-$-type channel region formed by doping with a P-type impurity. Thus, the polycrystalline silicon transistor 3 having the N-type conduction channel is formed.

A method of producing the semiconductor device will now be described in detail.

First, the process for growth of the polycrystalline silicon film 4 will be described with reference to FIGS. 2(A) to 2(C). Referring to FIG. 2(A), a polycrystalline silicon film 4a starts to be deposited on the silicon oxide film 2. The size of crystal grains in this initially deposited polycrystalline silicon film 4a is small, and the individual crystal grains have their crystallographic axes oriented at random as shown. As the deposition is further continued, a polycrystalline silicon film 4b as shown in FIG. 2(B) is formed. In this polycrystalline silicon film 4b, crystal grains having their <110> axes oriented in a direction perpendicular to the film surface grow selectively, and growth of crystal grains having any other orientations is suppressed by the crystal grains having the <110> orientation. FIG. 2(C) shows that a polycrystalline silicon film 4c having a film thickness equal to or more than a predetermined value of about 0.5 μm is deposited. In the polycrystalline silicon film 4c thus deposited, only those crystal grains having their <110> axes oriented in the direction perpendicular to the film surface 4d are theoretically present. Therefore, the crystal grains have a large size, and the crystallinity is improved. However, in a strict sense, not only those crystal grains having their crystallographic axes completely oriented in the direction perpendicular to the surface 4d of the polycrystalline silicon film 4c are present, but also, as a matter of fact, crystal grains having their <110> axes lying within a certain angular range with respect to the direction perpendicular to the film surface 4d will also be present in the film 4c.

By the way, at the film surface 4d of the polycrystalline silicon film 4, silicon atoms of individual crystals grow while being arranged along predetermined crystal faces respectively. Therefore, the adjacent crystals forming the same film surface define an angle therebetween thereby producing an asperity on the film surface. Further, because each of the individual crystals has a plurality of equivalent crystal faces, it is considered that the film surface 4d of the polycrystalline silicon film 4 is in a state in which a plurality of pyramids are present at random to produce an asperity as shown in FIG. 2(C). The surface roughness of the film surface 4d is determined by the degree of asperity produced on the film surface 4d. That is, this surface roughness is determined by the level difference between the top and the bottom of the pyramids. Therefore, the surface roughness of the film surface 4d is small when the crystal grains have a small size. On the other hand, when the crystal grains having a large size grow while overcoming those having a small size, the pyramids have a large size to increase the degree of asperity, resulting in degradation of the surface roughness of the film surface 4d. Such degradation of the surface roughness of the film surface 4d of the polycrystalline silicon film 4 is undesirable in that, during the process for making a polycrystalline silicon transistor as shown in FIG. 1, diffused reflection occurs at the film surface 4d thereby lowering the accuracy of mask dimensions. Further, because the carriers migrating through the N-type conduction channel are greatly scattered at the interface between the channel and the gate insulator film lying on the channel, the mobility of the carriers in the polycrystalline silicon transistor is decreased.

Therefore, it is necessary to make the film surface 4d of the polycrystalline silicon film 4 as flat and smooth as possible in order to obviate such a disadvantage. In the embodiment of the present invention, the required flattening and smoothing is achieved by depositing an amorphous silicon layer on the surface 4d of the polycrystalline silicon film 4 as described above.

How to flatten and smoothen the film surface 4d of the polycrystalline silicon film 4 will be described with reference to FIG. 3, FIGS. 4(A) to 4(D) and FIGS. 5(A) to 5(B).

In FIG. 3, the reference numeral 4 designates the polycrystalline silicon film described above, and 5' designates an amorphous silicon layer deposited on the rough surface 4d of the polycrystalline silicon film 4 before being turned into the solid-phase growth layer 5. Unlike the polycrystalline silicon, amorphous silicon has no periodicity. Therefore, the amorphous silicon can be isotropically deposited on the polycrystalline silicon film 4 without regard to the crystallinity of the polycrystalline silicon film 4. In FIG. 3, the symbols $l_1$ and $l_2$ designate the level difference of the asperity of the surface of the polycrystalline silicon film 4 and that of the amorphous silicon layer 5' respectively. The degree of the surface asperity of the polycrystalline silicon film 4 will now be compared with that of the amorphous silicon layer 5'. In order to simplify the calculation, it is assumed that the amorphous silicon layer 5' has a thickness t, the slope of the asperity of the surface 4d of the polycrystalline silicon film 4 has an inclination angle $\theta$ with respect to a horizontal plane as shown, and the amorphous silicon layer 5' is deposited concentrically around the top A of the pyramid. When the value of $l_2$ is calculated under the above assumption, it is given by the following equation (1):

$$l_2 = (l_1 + t) - \frac{t}{\cos\theta} \qquad (1)$$

Using the equation (1), the difference between the values of $l_1$ and $l_2$ is calculated according to the following equation (2):

$$\begin{aligned}l_1 - l_2 &= l_1 - \left\{l_1 + t\left(1 - \frac{1}{\cos\theta}\right)\right\} \\ &= t\left(\frac{1}{\cos\theta} - 1\right)\end{aligned} \qquad (2)$$

In the equation (2), t>0 and 0<cos $\theta$<1, since 0<$\theta$<90°. Therefore, the result is $l_1-l_2>0$, that is, $l_1>l_2$. Thus, the degree of asperity of the film surface can be alleviated when the amorphous silicon layer 5' is isotropically deposited on the polycrystalline silicon film 4 without regard to the direction of crystallization of the crystals of the polycrystalline silicon film 4. When the actual thickness of the polycrystalline silicon film 4 is 1.5 μm, the level difference $l_1$ between the top and the bottom of its surface asperity is about 300 Å. When it is now desired to decrease the value of ($l_1-l_2$) to about 200 Å and it is assumed that the value of $\theta$ is $\theta=30°$, the value of t is calculated as t≃1,300 Å by substituting these values in the equation (2) as follows:

$$200 \simeq t\left(\frac{1}{\cos 30°} - 1\right)$$

Thus, at least about 1,300 Å is required as the thickness t of the amorphous silicon layer 5'.

Figure 4A:
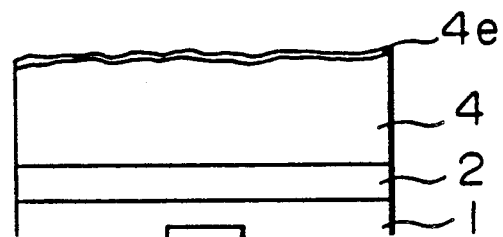
FIGS. 4(A) to 4(D) are schematic sectional views showing the steps before and after the deposition of the amorphous silicon layer.
Figure 4B:
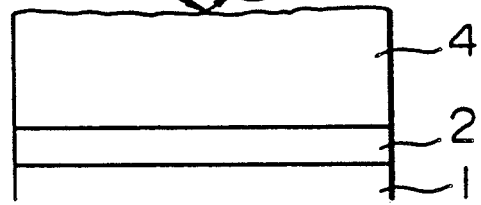
Figure 4C:
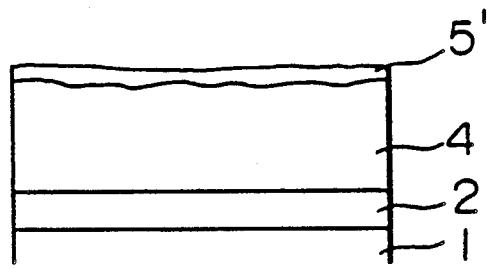
Figure 4D:
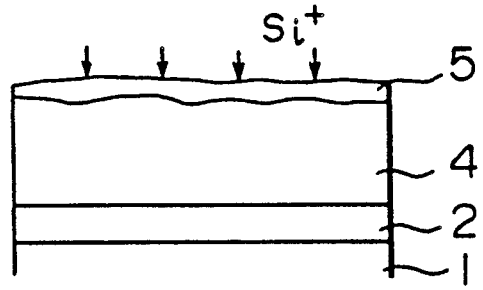

FIGS. 4(A) to 4(D) and FIGS. 5(A), 5(B) show the steps of forming the solid-phase growth layer 5 on the basic polycrystalline silicon film 4. A silicon oxide film 4e formed by natural oxidation is present on the surface of the polycrystalline silicon film 4 as shown in FIG. 4(A), and it is necessary to remove this silicon oxide film 4e before deposition of the amorphous silicon layer 5'. The silicon wafer is placed in an evacuated chamber for removing this oxide film 4e, and the oxide film 4e is removed by means of sputtering with an inert gas such as argon as shown in FIG. 4(B). Then, the amorphous silicon layer 5' is immediately deposited by means of CVD or sputtering in the same chamber without exposing the wafer to the atmosphere, as shown in FIG. 4(C). Then, amorphousness of the amorphous silicon layer 5' is further promoted by means of ion implantation as shown in FIG. 4(D).

Figure 5A:
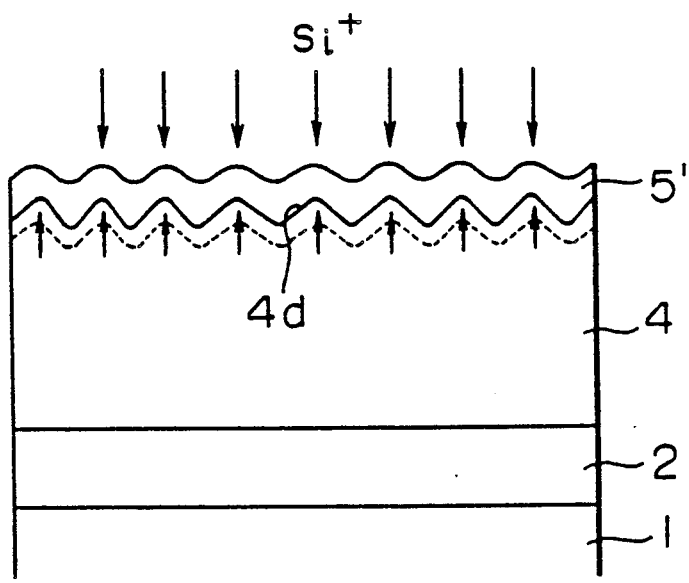
FIGS. 5(A) and 5(B) are schematic sectional views illustrating the effect of silicon ion implantation into the amorphous silicon layer to cause growth of the solid-phase growth layer.
Figure 5B:
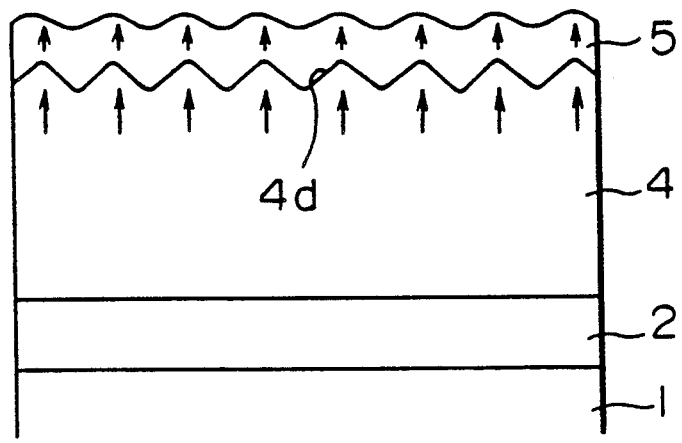

A $Si^+$ ion which does not change the physical properties of silicon is preferably used for the ion implantation described above. This implantation of $Si^+$ ions exhibits three important effects. The first effect is the promotion of the amorphousness described above. The second effect is that the $Si^+$ ions are implanted to a position deeper than the interface between the amorphous silicon layer 5' and the polycrystalline silicon film 4 to damage the interface, thereby destroying the interface formed immediately after the deposition of the amorphous silicon layer 5' and eliminating the possibility of discontinuity of growth of the solid-phase growth layer 5 formed later. The acceleration voltage required for the $Si^+$ ion implantation to attain the above purpose is such that the projected range of implanted $Si^+$ ions exceeds at least the film thickness of the amorphous silicon layer 5'. The third effect is that the direction of implantation of the $Si^+$ ions is perpendicular to the surface of the polycrystalline silicon film 4. The crystals of the polycrystalline silicon film 4 have their <110> orientation originally dispersed within a certain angular range with respect to the direction perpendicular to the film surface. However, because the $Si^+$ ions are implanted in the direction perpendicular to the surface of the polycrystalline silicon film 4, the structure of the crystals is destroyed by the implanted $Si^+$ ions as shown in FIG. 5(A). As a result, the solid-phase growth layer 5 grown on the polycrystalline silicon film 4 has a crystallinity oriented in the direction perpendicular to the surface of the polycrystalline silicon film 4 as shown in FIG. 5(B).

Figure 6:
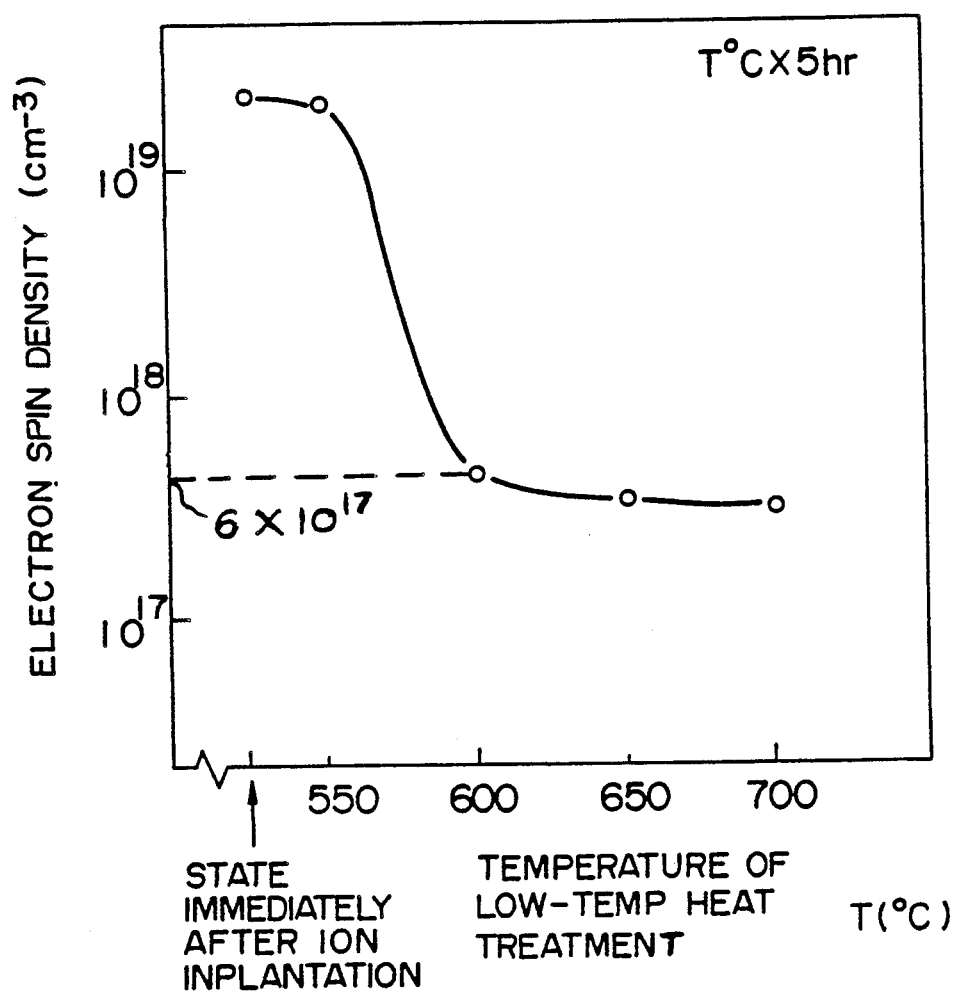
FIG. 6 is a graph showing the relation between the electron spin density and the heat treatment temperature for confirming the conditions suitable for growth of the solid-phase growth layer after the step of silicon ion implantation.

FIG. 6 is a graph showing the relation between the electron spin density and the heat treatment temperature T for confirming the conditions suitable for growth of the solid-phase growth layer 5 after the step of $Si^+$ ion implantation. This electron spin density represents the number of unpaired electrons in silicon. The higher the spin density, there are more lattice defects, and the silicon has its physical properties closer to its amorphous state. It will be seen in FIG. 6 that, when the period of the heat treatment is set constant at 5 hours, the value of the spin density at T=550° C. is substantially equal to that measured immediately after the step of $Si^+$ ion implantation, and the silicon remains in its amorphous state. When the heat treatment temperature T is higher than T=600° C., the value of the spin density decreases by about $10^2$, and the solid-phase growth occurs. On the other hand, when the heat treatment is carried out at a high temperature exceeding T=700° C., nuclei of crystals are produced in the amorphous silicon layer 5', and the crystallinity of the basic polycrystalline silicon film 4 is hardly succeeded. It will be apparent from the above discussion that the desired solid-phase growth layer 5 can be successfully formed by heat treating the amorphous silicon layer 5' for a long period of, for example, more than 5 hours in a low temperature range of 600° C. to 700° C. Then, high-temperature heat treatment, for example, heating at a temperature higher than 1,000° C. for a period of time of more than 1 hour is carried out so as to remove internal defects of the crystals of the solid-phase growth layer 5.

After patterning the solid-phase growth layer 5 and polycrystalline silicon film 5 obtained by the steps described above, dry etching is applied to separate them from others on the oxide film 2. The islands thus separated from each other are subjected to customary transistor manufacturing steps, and an N-channel polycrystalline silicon transistor 3 as, for example, shown in FIG. 1 is formed.

When the N-channel polycrystalline silicon transistor 3 having the illustrated structure is formed on the oxide insulator film 2, while, on the other hand, a P-channel transistor is formed in the silicon substrate 1, these transistors can be completely electrically isolated from each other by the oxide film 2. The effect is entirely similar to that described above even when the transistor types are entirely reverse to those described above.

Figure 7:
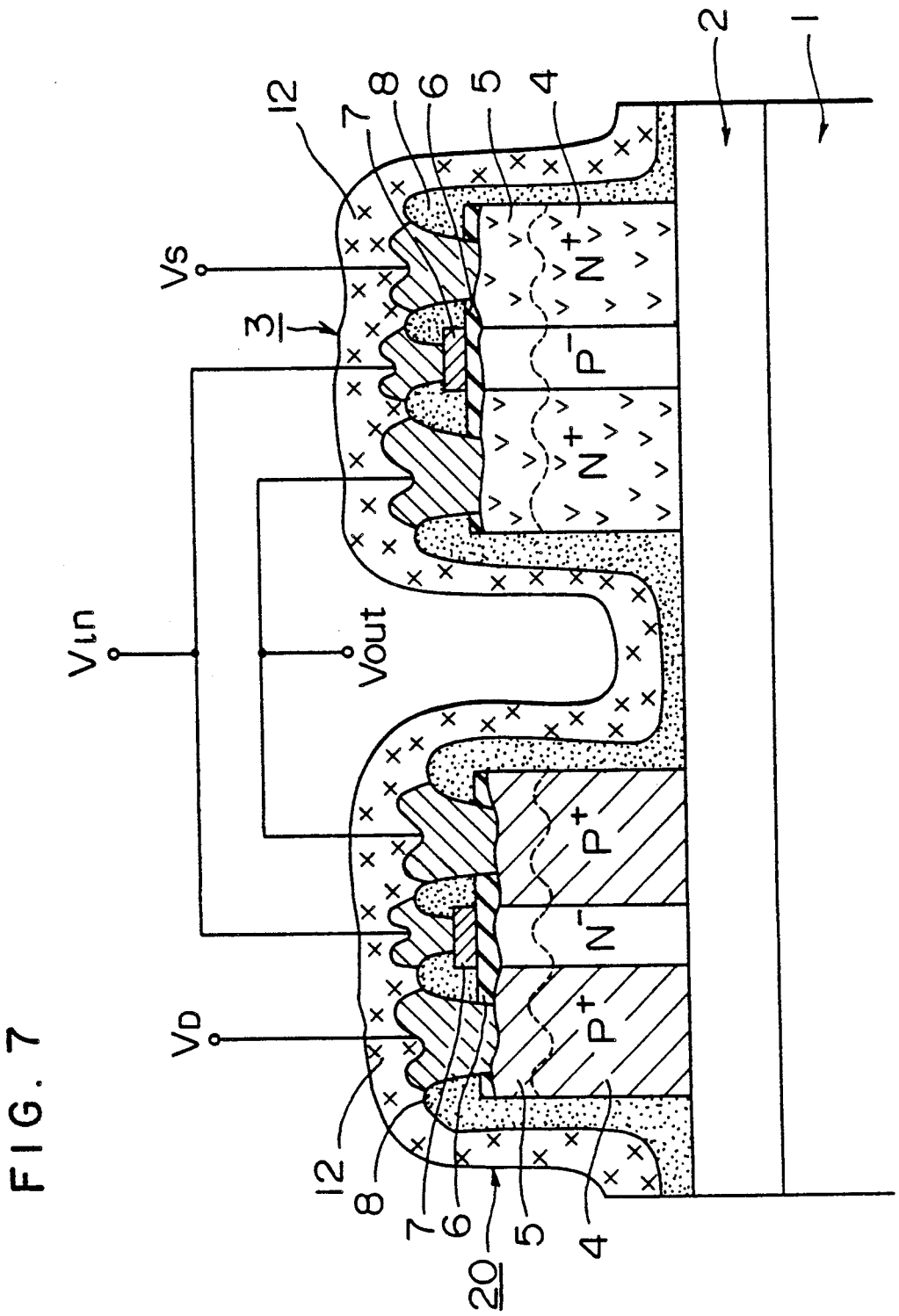
FIG. 7 is a schematic, partly longitudinal sectional view of a second embodiment of the semiconductor device according to the present invention.

FIG. 7 shows the internal structure of a second embodiment of the semiconductor device according to the present invention. In the first embodiment, only one of an N-channel polycrystalline silicon transistor and a P-channel polycrystalline silicon transistor is formed on an oxide film. In the second embodiment shown in FIG. 7, polycrystalline silicon transistors of both an N-channel type and a P-channel type respectively are formed on an oxide film to provide a semiconductor device which acts as an inverter. In FIG. 7, the same reference numerals are used to designate the same parts appearing in FIG. 1. In FIG. 7, the reference numerals 3 and 20 generally designate the N-channel polycrystalline silicon transistor and a P-channel polycrystalline silicon transistor respectively each of which is made according to the method described already. In the illustrated semiconductor device, the transistor regions are separated from each other by the oxide insulator film 2 so that they are completely electrically isolated from each other.

Although the aforementioned embodiments have referred to the manufacture of transistors only, it is apparent that the present invention is also applicable to the manufacture of other semiconductor devices including diodes.

It will be understood from the foregoing detailed description of the present invention that the channel region of the polycrystalline silicon transistor formed on the insulator oxide film has a flat and smooth interface between it and the gate insulator film and is formed of crystals having their crystallographic axes oriented in the direction perpendicular to the above interface, so that the electrical properties including the electrical conductivity and carrier mobility of the transistor can be improved. Therefore, an integrated circuit having an improved rate of transistor integration per chip can be provided, and a highly reliable semiconductor device can be realized in which the so-called latch-up can be prevented and leak current can be decreased. Also, according to the method of the present invention, a semiconductor device of SOI structure can be reliably and easily made at a low cost by the use of polycrystalline silicon which is highly useful as described above.

We claim:

1. A semiconductor device comprising a silicon substrate, a silicon oxide film formed on said substrate and a polycrystalline silicon transistor formed on said oxide film, wherein said transistor comprises:

a first polycrystalline silicon layer having a thickness in a range between 0.5 μm to 1.5 μm and containing crystal grains having their (110) axes oriented perpendicular to a surface thereof, said first polycrystalline silicon layer being formed on said oxide film and having first asperities formed on a surface thereof;

a second polycrystalline silicon layer formed on said first polycrystalline silicon layer for defining source, channel and drain regions, and having a crystallinity substantially lattice-matched to that of said first polycrystalline silicon layer, said second polycrystalline silicon layer having a structure to compensate for the asperities on the surface of said first polycrystalline silicon layer and to flatten said surface and being used as an active region;

a polysilicon gate, and a gate insulating film formed with said gate through said gate insulating film on the second polycrystalline silicon layer of said channel region;

source, drain and gate electrodes respectively formed on the second polycrystalline silicon layer of said source region, drain region and said polysilicon gate; and an interlayer insulator film insulating said polysilicon gate and said gate electrode at least from said source and drain electrodes.

2. A semiconductor device according to claim 1 comprising at least two polycrystalline silicon transistors one of which is an N-channel transistor comprising said source and drain regions doped with N-type dopant, and the other of which is a P-channel transistor comprising said source and drain regions doped with P-type dopant.

3. A semiconductor device of an SOI structure comprising:

a substrate;

an amorphous insulator layer formed on said substrate;

a first polycrystalline silicon layer having a thickness in a range of 0.5 μm to 1.5 μm formed on said amorphous insulator layer, said first polycrystalline silicon layer having crystallographic axes of crystal grains oriented at random in the vicinity of an interface between said first polycrystalline silicon layer and said amorphous insulator layer, and having (110) axes of the crystal grains oriented in a direction substantially perpendicular to a surface of said substrate in the vicinity of a surface of said first polycrystalline silicon layer opposite said interface, said first polycrystalline silicon layer having first asperities formed on the surface thereof; and a second polycrystalline silicon layer formed on said first polycrystalline silicon layer and having a crystal grain size and the (110) axes orientation similar to that of said first polycrystalline layer, said second polycrystalline silicon layer having second asperities formed on a surface thereof, said second asperities being smaller than said first asperities of said first polycrystalline silicon layer, said second polycrystalline silicon layer being used as an active region.

4. A semiconductor device according to claim 3, wherein the thickness of said second polycrystalline silicon layer is larger than 1,300 Å.

* * * * *